(12) United States Patent
Kitamura et al.

(10) Patent No.: US 6,969,884 B2
(45) Date of Patent: Nov. 29, 2005

(54) SEMICONDUCTOR DEVICE AND METHOD OF MANUFACTURING THE SAME

(75) Inventors: Yoshinori Kitamura, Tsu (JP); Shigeki Sugimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/728,928

(22) Filed: Dec. 8, 2003

(65) Prior Publication Data
US 2005/0051834 A1    Mar. 10, 2005

(30) Foreign Application Priority Data
Sep. 9, 2003   (JP)   .............................. 2003-316794

(51) Int. Cl.⁷ ................... H01L 21/331; H01L 21/8222
(52) U.S. Cl. ..................... 257/315; 257/314
(58) Field of Search ................ 257/314–316, 257/321

(56) References Cited

U.S. PATENT DOCUMENTS

| | | | |
|---|---|---|---|
| 4,369,565 A | | 1/1983 | Muramatsu |
| 5,698,879 A | * | 12/1997 | Aritome et al. ............. 257/315 |
| 5,949,101 A | | 9/1999 | Aritome |
| 6,403,421 B1 | * | 6/2002 | Ikeda et al. ................. 438/267 |
| 6,720,610 B2 | | 4/2004 | Iguchi et al. |
| 6,768,161 B2 | | 7/2004 | Kinoshita |

FOREIGN PATENT DOCUMENTS

| | | |
|---|---|---|
| JP | 7-254652 | 10/1995 |
| JP | 11-317464 | 11/1999 |
| JP | 2001-168306 | 6/2001 |

OTHER PUBLICATIONS

Peter VanDerVoom, et al., CMOS Shallow-Trench-Isolation to 50-nm Channel Widths, IEEE Transactions on Electron Devices, vol. 47, No. 6, Jun. 2000, pp. 1175-1182.

* cited by examiner

Primary Examiner—Phat X. Cao
Assistant Examiner—Theresa T. Doan
(74) Attorney, Agent, or Firm—Oblon, Spivak, McClelland, Maier & Neustadt, P.C.

(57) ABSTRACT

Disclosed is a semiconductor device comprising a semiconductor substrate including first and second element-formation regions partitioned by an isolation trench, first and second lower gate insulating films formed on the first and second element-formation regions, first and second floating gates formed on the first and second lower gate insulating films, an isolation insulating film formed at least in the isolation trench and has a depression formed in an upper surface thereof, an upper gate insulating film formed on the first and second floating gates, and a control gate line including an opposed portion opposed to the first and second floating gates, with the upper gate insulating film being interposed, and a portion located inside the depression, the first floating gate including a side surface opposed to the second floating gate and entirely aligns with a side surface included in the first element-formation region and defined by the isolation trench.

6 Claims, 7 Drawing Sheets

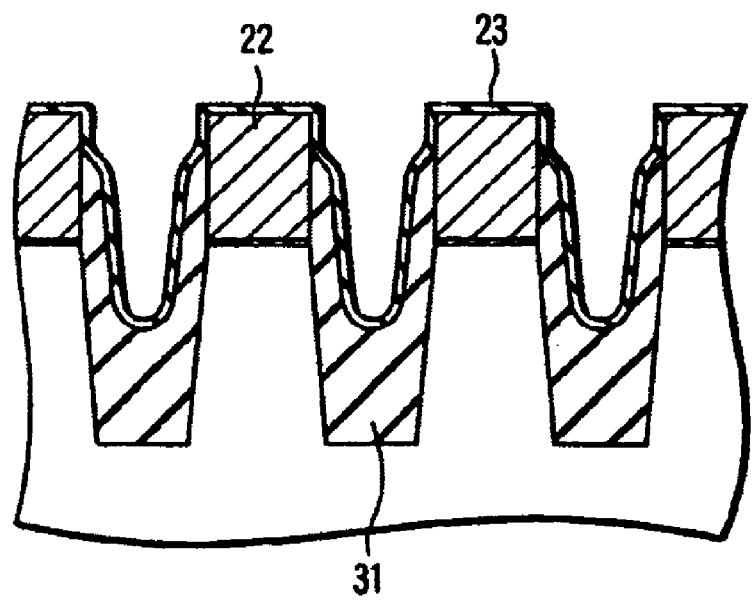
F I G. 10
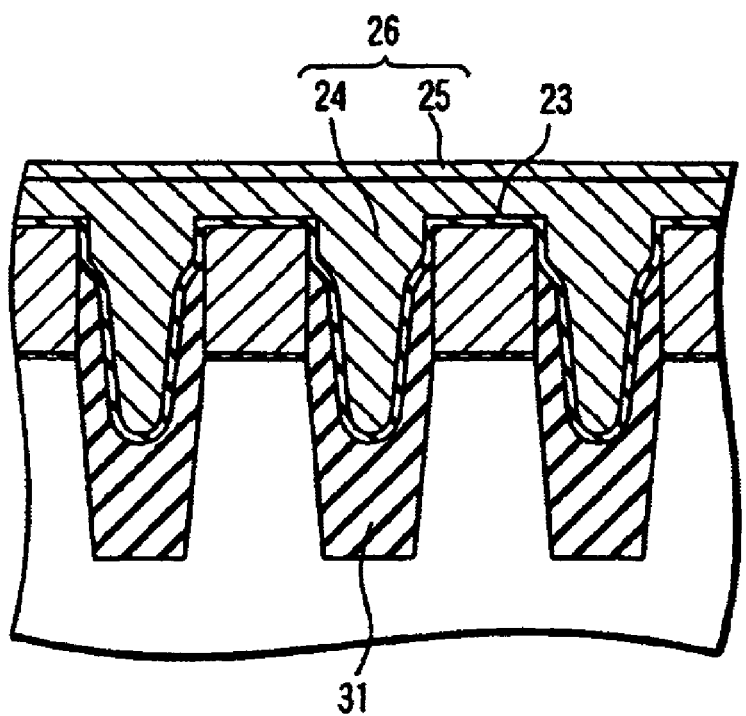
F I G. 11

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2003-316794, filed Sep. 9, 2003, the entire contents of which are incorporated herein by reference.

BACKGROUND OF THE INVENTION

1. Field of the Invention

The present invention relates to a semiconductor device and a method of manufacturing the same.

2. Description of the Related Art

In recent years, there is an increased demand for non-volatile semiconductor memory devices, such as EEPROMs. A nonvolatile semiconductor memory device has problems in that where adjacent ones of memory cells in the word-line direction are close to each other, the capacitive coupling between the adjacent floating gates inevitably increases.

To solve this problem, a depression is formed in an isolation insulating film between memory cells, and a control gate line (word line) is formed in the depression (which is disclosed, for example in Jpn. Pat. Appln. KOKAI Publication No. 2001-168306). A method for providing such a structure will be described, referring to FIGS. 13–15.

In FIG. 13, reference numeral 101 denotes a semiconductor substrate comprising an isolation trench 103 and an element-forming region 102. Numeral 104 denotes an isolation insulating film, numeral 105 denotes a lower gate insulating film (a tunnel insulating film), and numerals 106a and 106b denote polysilicon films serving as a floating gate. In the process illustrated in FIG. 13, the isolation insulating film 104 and polysilicon film 106a are overlaid with polysilicon film 106b, and a silicon oxide film 111 is formed on polysilicon film 106b. After the silicon oxide film 111 is patterned by lithography and etching, a film used for preparing side spacers is formed on the entire surface of the resultant structure. The film is etched by RIE or the like in such a manner that side spacers 112 are left on the side surfaces of the silicon oxide film 111. In this manner, the silicon oxide film 111 and the side spacers 112 define an etching mask having an opening portion 113.

Next, the polysilicon film 106b and the isolation insulating film 104 are etched, using the above-mentioned etching mask. As a result, a hollow portion 114 is defined, as shown in FIG. 14.

As shown in FIG. 15, the etching mask is removed, an upper gate insulating film (an ONO film) 107 is formed, and a polysilicon film 108a and a WSi film 108b, serving as control gate lines, are formed. Subsequently, the WSi film 108b, the polysilicon film 108a, the upper gate insulating film 107, the polysilicon films 106b and 106a, are patterned for isolation of memory cells.

In the prior art described above, the capacitive coupling between the adjacent floating gates (namely, the polysilicon films 106a and 106b) can be suppressed by filling the hollow portion 114 of the isolation insulating film 104 with the polysilicon film 108a.

However, since lithography is used for patterning the silicon oxide film 111 in the prior art described above, there may be an alignment error between the pattern of the silicon oxide film 111 and the pattern of the isolation trench 103 (the isolation insulating film 104). In order to form the hollow portion 114 reliably in the isolation insulating film 104, the width of the etching mask composed of the silicon oxide film 111 and the side spacers 112 must be provided with a margin. In other words, the width of the opening portion 113 of the etching mask must be less than the width of the isolation trench 103 by the dimension corresponding to the margin. As a result, the width of the hollow portion 114, which is formed by etching the polysilicon film 106b and the isolation insulating film 104, is naturally less than the width of the isolation trench 103. Where the adjacent memory cells are arranged at short intervals (in other words, the isolation trench 103 is narrow), it is very difficult to fill the hollow portion 114 with the polysilicon film 108a. Hence, the capacitive coupling between floating gates is hard to suppress.

As described above, the prior art has problems in that if the isolation trench has a reduced width, a control gate line cannot be easily formed in the hollow portion 114 of the isolation insulating film, and the capacitive coupling between floating gates is hard to suppress.

BRIEF SUMMARY OF THE INVENTION

A semiconductor device according to a first aspect of the present invention comprises: a semiconductor substrate including first and second element-formation regions which are partitioned by an isolation trench; first and second lower gate insulating films formed on the first and second element-formation regions, respectively; first and second floating gates formed on the first and second lower gate insulating films, respectively; an isolation insulating film which is formed at least in the isolation trench and which has a depression formed in an upper surface thereof; an upper gate insulating film formed on the first and second floating gates; and a control gate line including an opposed portion which is opposed to the first and second floating gates, with the upper gate insulating film being interposed, and a portion located inside the depression, the first floating gate including a side surface which is opposed to the second floating gate and which entirely aligns with a side surface included in the first element-formation region and defined by the isolation trench, and the second floating gate including a side surface which is opposed to the first floating gate and which entirely aligns with a side surface included in the second element-formation region and defined by the isolation trench.

A method of manufacturing a semiconductor device according to a second aspect of the present invention comprises: forming a lower gate insulating film on a semiconductor substrate; forming a floating gate material film on the lower gate insulating film; patterning the floating gate material film, the lower gate insulating film and the semiconductor substrate to form first and second pattern regions partitioned by a trench; forming a lower insulating film having a first depression in the trench; forming an upper insulating film on the lower insulating film to fill the first depression with the upper insulating film; etching the upper insulating film at an etching rate higher than an etching rate of the lower insulating film to form a second depression corresponding to the first depression in the lower insulating film; forming an upper gate insulating film on the patterned floating gate material films included in the first and second pattern regions; and forming a control gate material film on the upper gate insulating film and in the second depression.

BRIEF DESCRIPTION OF THE SEVERAL VIEWS OF THE DRAWING

FIG. 10 is a sectional view schematically illustrating part of the semiconductor device-manufacturing process according to the embodiment of the present invention.

FIG. 11 is a sectional view schematically illustrating part of the semiconductor device-manufacturing process according to the embodiment of the present invention.

DETAILED DESCRIPTION OF THE INVENTION

Embodiments of the present invention will now be described with reference to the accompanying drawings.

Figure 1:
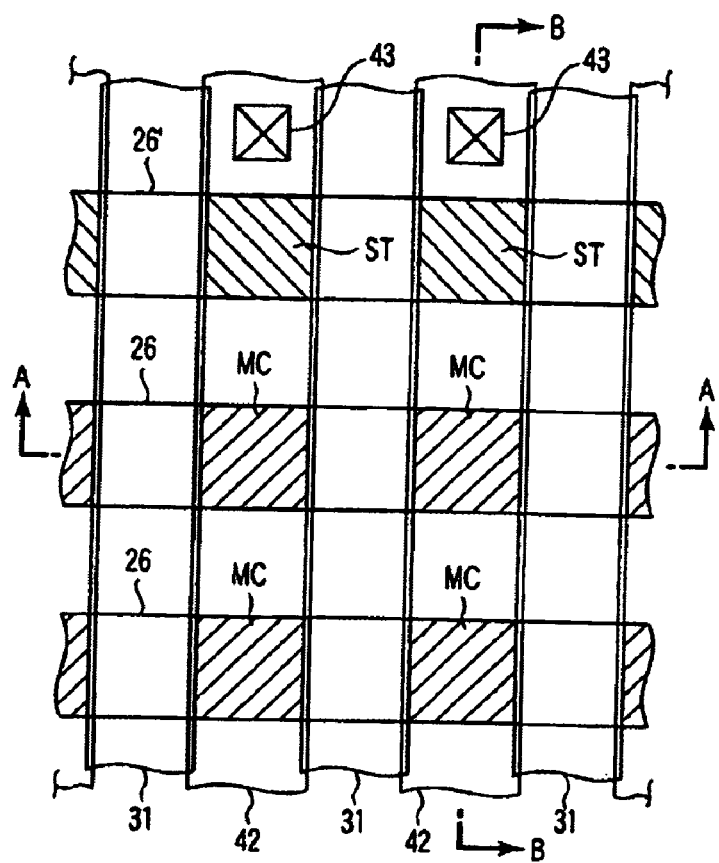
FIG. 1 is a plan view schematically showing a semiconductor device according to an embodiment of the present invention.

FIG. 1 is a plan view schematically showing a semiconductor device (a NAND type nonvolatile semiconductor memory device) according to an embodiment of the present invention.

As shown in FIG. 1, each NAND cell unit comprises a plurality of memory cells MC connected in series, and a selection transistor ST connected to the memory cell MC. The memory cells MC, arrayed in the direction of word line, are connected together by a common control gate line (word line) 26, and the selection transistors ST are connected together by a common selection gate line 26'. Bit lines 42 are connected to the respective selection transistors ST through bit line contacts 43.

Figure 2A:
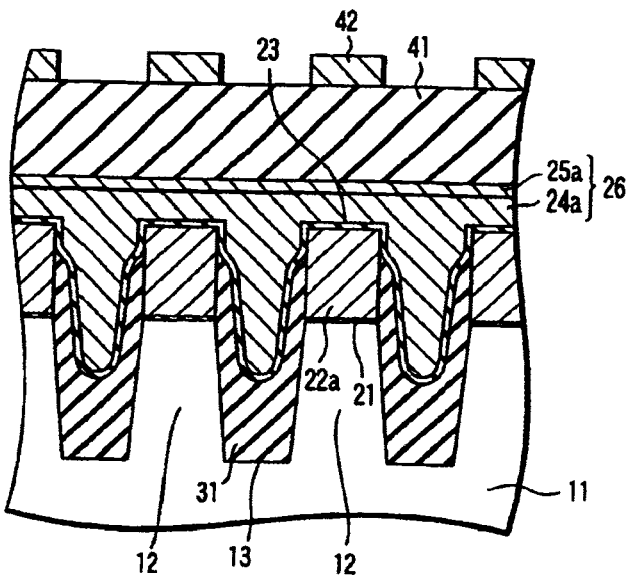
FIGS. 2A and 2B are sectional views schematically illustrating the semiconductor device according to the embodiment of the present invention.
Figure 2B:
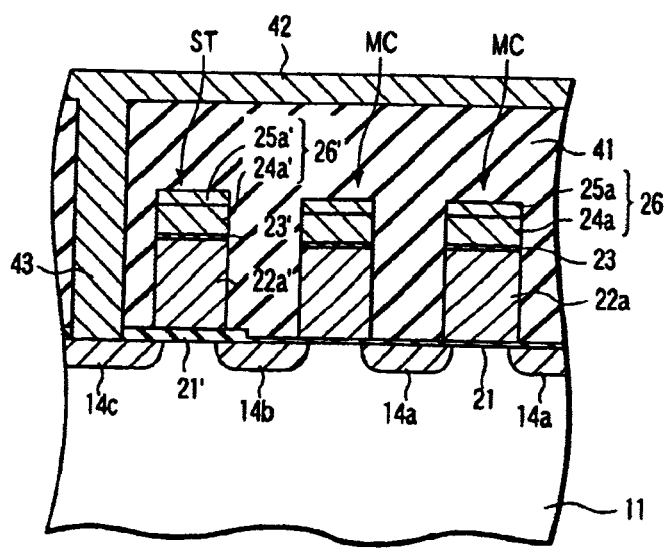

FIG. 2A is a sectional view taken along line A—A of FIG. 1, and FIG. 2B is a sectional view taken along line B—B of FIG. 1.

Referring to FIGS. 2A and 2B, a semiconductor substrate (a silicon substrate) 11 comprises a plurality of element-formation regions 12, and the adjacent element-formation regions 12 are partitioned by an isolation trench 13. The memory cells MC and the selection transistors ST are formed in the element-formation regions 12. Source/drain diffusion layer 14a is owned commonly by the memory cells MC that are adjacent to each other in the direction of bit lines, source/drain diffusion layer 14b is owned commonly by the memory cell MC and the selection transistor ST, and source/drain diffusion layer 14c is owned commonly by the selection transistors ST that are opposed to each other, with the bit line contact 43 being located therebetween.

Each memory cell MC comprises a lower gate insulating film (a tunnel insulating film) 21, a floating gate 22a, an upper gate insulating film (an ONO film) 23, and a control gate (a control gate line) 26 made up of a polysilicon film 24a and a tungsten silicide film (a WSi film) 25a. As will be described later, when the isolation trench 13 is patterned, a floating gate material film and the lower gate insulating film 21 are patterned simultaneously. Hence, the floating gate 22a, the lower gate insulating film 21 and the element-formation regions 12 have their side surfaces (i.e., the side surfaces partitioned by the isolation trench 13) aligned with one another.

An isolation insulating film 31 having a depression is formed in the isolation trench 13. The isolation insulating film 31 includes a portion extending upward, and this extending portion is in contact with the side surface of the floating gate 22a. The control gate line 26 (i.e., polysilicon film 24a in the illustrated embodiment) is formed in the depression of the isolation insulating film 31. The control gate line 26 serves to suppress the capacitive coupling between the adjacent floating gates 22a.

The films 22a', 23', 24a' and 25a' of selection transistor ST are made of the same films 22a, 23, 24a and 25a of memory cell MC, respectively. It should be noted that the selection gate line 26' is connected to the electrode 22a' at a position not illustrated. The gate insulating film 21' is thicker than the lower gate insulating film 21 of memory cell MC.

The memory cells MC and the selection transistors ST are covered with an interlayer insulating film 41. A bit line 42 is formed on the interlayer insulating film 41, and is connected to source/drain diffusion layer 14c through the bit line contact 43.

A method for manufacturing the semiconductor device of the above embodiment will now be described with reference to FIGS. 3–12. FIGS. 3–11 and FIG. 12A correspond to the section taken along line A—A of FIG. 1, and FIG. 12B corresponds to the section taken along line B—B of FIG. 1.

Figure 3:
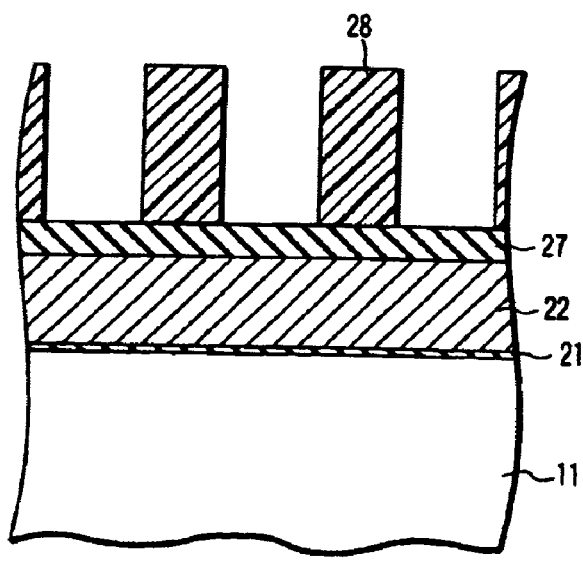
FIG. 3 is a sectional view schematically illustrating part of the semiconductor device-manufacturing process according to the embodiment of the present invention.

As shown in FIG. 3, a silicon oxide film having a thickness of about 10 nm is formed on the semiconductor substrate (silicon substrate) 11 by thermal oxidation. The silicon oxide film serves as the lower gate insulating film 21. A gate insulating film should be preferably thicker at positions where selection transistors are to be formed. Subsequently, a polysilicon film having a thickness of about 160 nm is formed by LP-CVD (low-pressure chemical vapor deposition). The polysilicon film serves as the floating gate material film 22. In addition, a silicon nitride film 27 having a thickness of about 90 nm is formed by LP-CVD. This silicon nitride film 27 serves as a stopper film in the CMP (chemical mechanical polishing) process. Then, a photoresist pattern 28 is formed on the silicon nitride film 27 by use of lithography.

Figure 4:
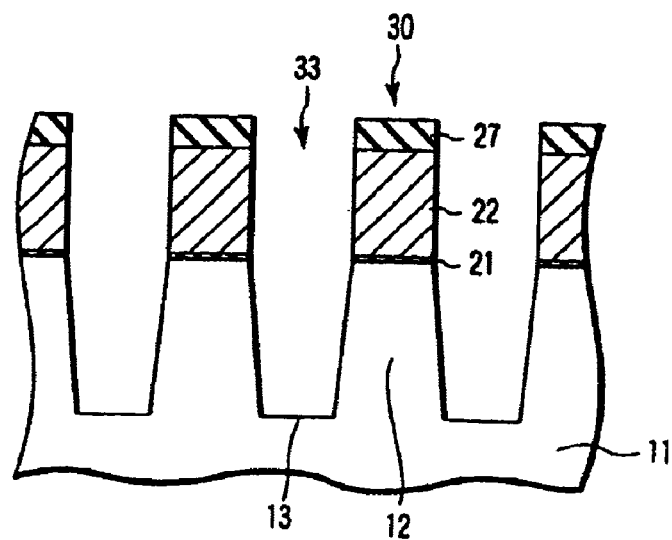
FIG. 4 is a sectional view schematically illustrating part of the semiconductor device-manufacturing process according to the embodiment of the present invention.

As shown in FIG. 4, the silicon nitride film 27, the polysilicon film 22, the lower gate insulating film 21 and the semiconductor substrate 11 are etched, using the photoresist pattern 28 as an etching mask. As a result, a trench 33 and a pattern region 30 are formed. The pattern region 30 is made up of the silicon nitride film 27, the polysilicon film 22, the lower gate insulating film 21 and the semiconductor substrate 11. An element-formation region 12 and an isolation trench 13 (which has a depth of about 220 nm) are formed in the semiconductor substrate 11. Patterned with the same photoresist pattern 28, the polysilicon film 22, the lower gate insulating film 21 and the element-formation region 12 have their side surfaces (i.e., the side surfaces partitioned by the isolation trench 13) aligned with one another.

Figure 5:
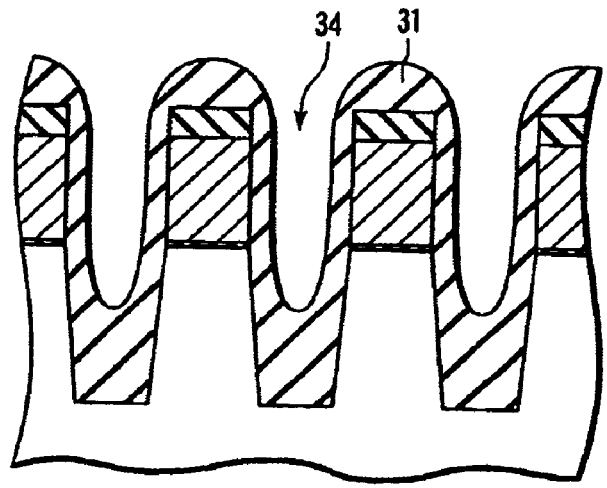
FIG. 5 is a sectional view schematically illustrating part of the semiconductor device-manufacturing process according to the embodiment of the present invention.

As shown in FIG. 5, a silicon oxide film having a depression 34 is formed by plasma CVD. The silicon oxide film is a lower insulating film 31 serving as an isolation insulating film. The thickness of the silicon oxide film 31 is smaller than half the width of the trench 33, so that the depression 34 can be formed in the trench 33. More specifically, the thickness of the silicon oxide film 31 is determined in consideration of the width and depth of the trench 33 in such a manner as to form a desired depression 34. In the present embodiment, the thickness of the silicon oxide film 31 is controlled to be about 200 nm in flat regions (not shown).

Figure 6:
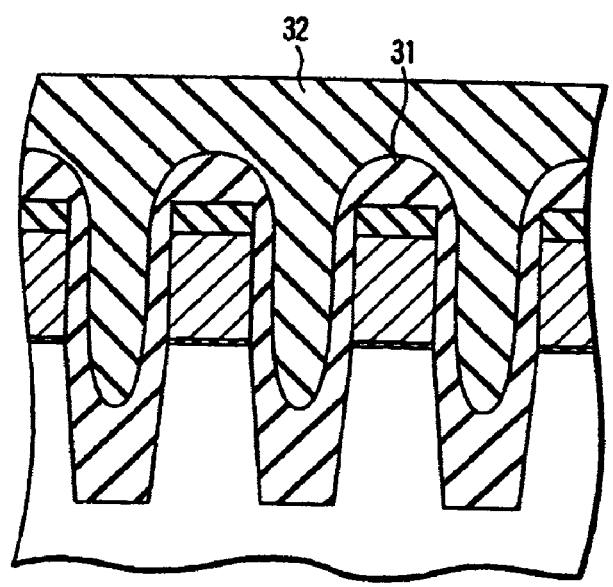
FIG. 6 is a sectional view schematically illustrating part of the semiconductor device-manufacturing process according to the embodiment of the present invention.

As shown in FIG. 6, the resultant structure is coated with polysilazane, and this material is subject to heat treatment in the vapor-containing oxidizing atmosphere, so as to densify the material. As a result, an upper insulating film 32 formed of polysilazane is obtained. The upper insulating film 32 formed of a coated film such as polysilazane is advantageous in that the depression 34 can be easily filled even if it is deep.

Figure 7:
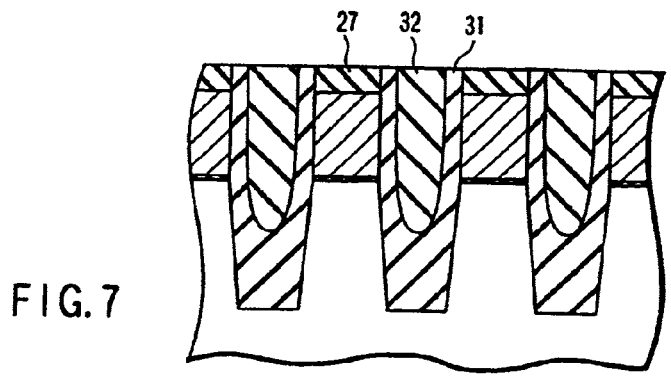
FIG. 7 is a sectional view schematically illustrating part of the semiconductor device-manufacturing process according to the embodiment of the present invention.

As shown in FIG. 7, the upper insulating film 32 and the lower insulating film 31 are removed by CMP, except for the portions located inside the trench 33, and the surfaces of the remaining upper and lower insulating films 32 and 31 are flattened. The silicon nitride film 27 functions as a stopper of the CMP process. But for the upper insulating film 32, polishing particles in the CMP process would stay in the depression 34. This does not become a problem as long as the depression 34 is filled with the upper insulating film 32.

Figure 8:
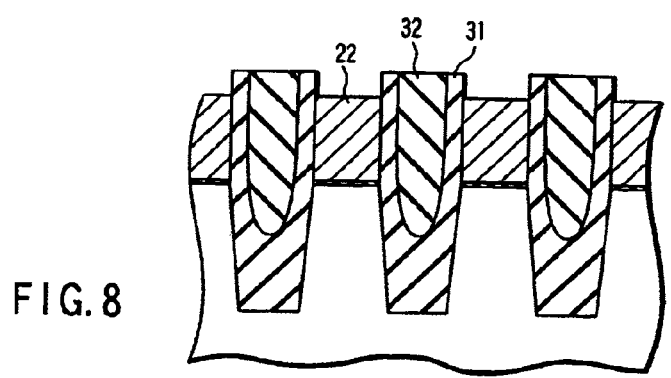
FIG. 8 is a sectional view schematically illustrating part of the semiconductor device-manufacturing process according to the embodiment of the present invention.

Then, the silicon nitride film 27 is removed to expose the upper surface of the polysilicon film 22, as shown in FIG. 8.

Figure 9:
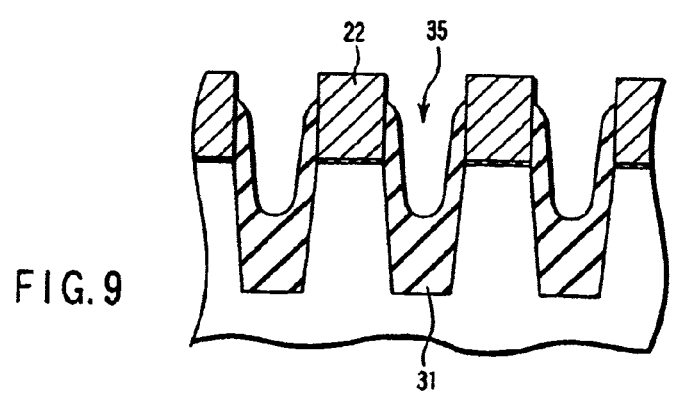
FIG. 9 is a sectional view schematically illustrating part of the semiconductor device-manufacturing process according to the embodiment of the present invention.

As shown in FIG. 9, the upper insulating film 32 is removed by etching, so as to form a depression 35 corresponding to the depression 34. This etching is selective etching, wherein the etching rate of the upper insulating film 32 is higher than that of the lower insulating film 31. In the present embodiment, the etching is executed, using a buffer hydrofluoric acid (i.e., a mixed solution of hydrofluoric acid and ammonium fluoride). The use of the buffer hydrofluoric acid increases the selection ratio of the etching rate of the polysilazane to that of the CVD silicon oxide film. The buffer hydrofluoric acid may be replaced with hydrofluoric acid vapor. Since the etching takes place from the upper portions of the films, the upper portions of the lower insulating film 31 are etched, exposing the side surface of the polysilicon film 22. How wide the side surface of the polysilicon film 22 is exposed (the exposure width) can be controlled by adjusting the etching conditions.

As shown in FIG. 10, an ONO film having predetermined thickness and serving as the upper gate insulating film 23 is formed by LP-CVD. The ONO film is a film made up of a silicon oxide film, a silicon nitride film and a silicon oxide film, which are stacked in the order mentioned. The upper gate insulating film 23 may be formed at least on the exposed surfaces of the polysilicon film 22. In the present embodiment, however, since the ONO film is deposited by LP-CVD, the upper gate insulating film 23 includes a portion extended onto the lower insulating film (isolation insulating film) 31. In regions where selection transistors are to be formed, the upper gate insulating film 23 is partially etched out to expose part of the polysilicon film 22.

As shown in FIG. 11, a control gate material film 26 is formed on the upper gate insulating film 23, thereby filling the depression 35 with the control gate material film 26. To be more specific, a polysilicon film 24 doped with phosphorous and having a thickness of about 80 nm is formed by LP-CVD, and subsequently a tungsten silicide film (a WSi film) 25 having a thickness of about 85 nm is formed by sputtering.

Figure 12A:
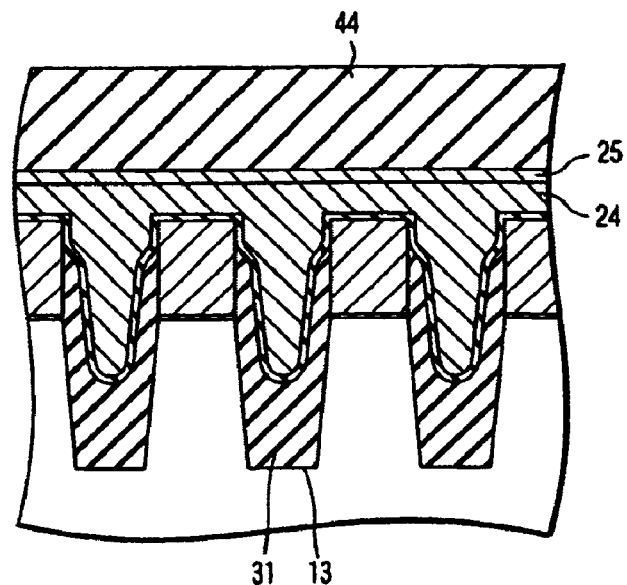
FIGS. 12A and 12B are sectional views schematically illustrating part of the semiconductor device-manufacturing process according to the embodiment of the present invention.
Figure 12B:
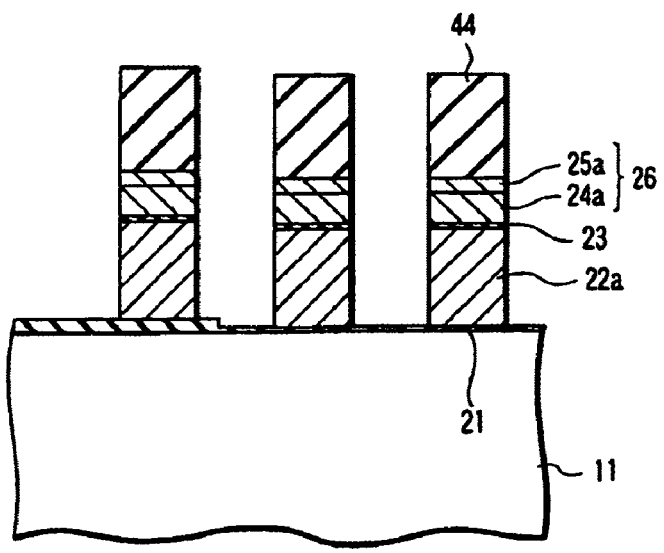
Figure 13:
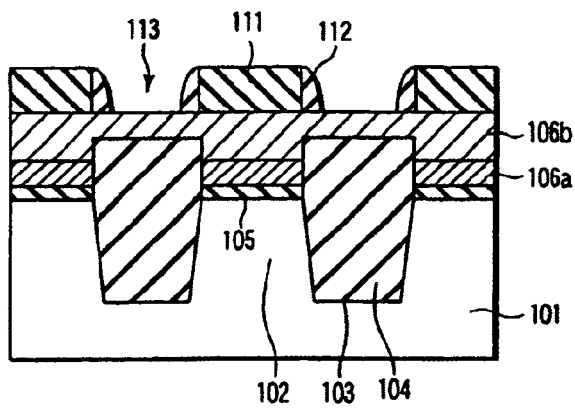
FIG. 13 is a sectional view schematically illustrating part of a semiconductor device-manufacturing process according to the prior art.
Figure 14:
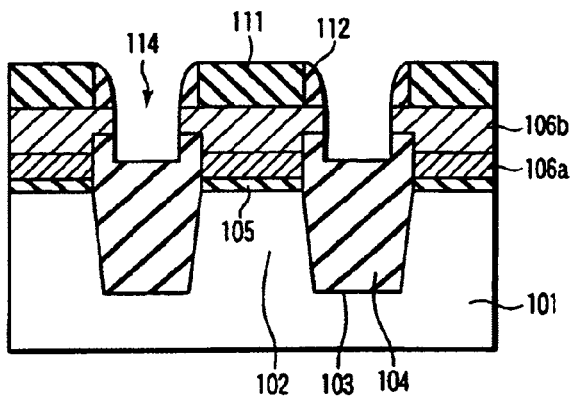
FIG. 14 is a sectional view schematically illustrating part of the semiconductor device-manufacturing process according to the prior art.
Figure 15:
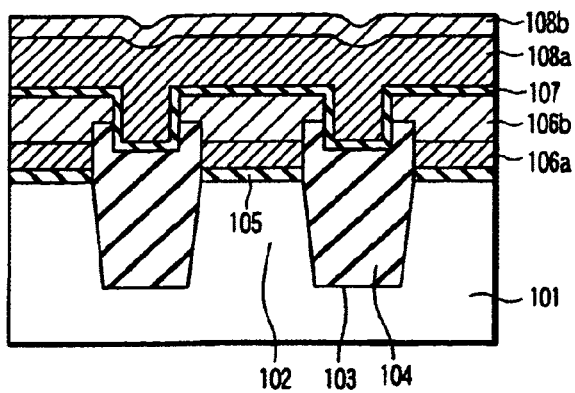
FIG. 15 is a sectional view schematically illustrating part of the semiconductor device-manufacturing process according to the prior art.

As shown in FIGS. 12A and 12B, a silicon nitride film having a thickness of about 300 nm is formed by LP-CVD. Moreover, a resist pattern (not shown) is formed on the silicon nitride film. The silicon nitride film is etched using the resist pattern as a mask. By this etching, a mask pattern 44 of the silicon nitride film is formed. The mask pattern 44 extends in the direction perpendicular to the direction in which the isolation trench 13 extends. Using the mask pattern 44 as an etching mask, the tungsten silicide film 25, the polysilicon film 24, the upper gate insulating film 23 and the polysilicon film 22 are patterned. As a result, a floating gate 22a is formed by patterning the polysilicon film 22, and a control gate line 26 is formed by patterning the polysilicon film 24a and the tungsten silicide film 25a.

Thereafter, source/drain diffusion layers 14a, 14b and 14c, an interlayer insulating film 41 and a bit line 43 are formed. In this manner, the semiconductor device shown in FIGS. 1, 2A and 2B is fabricated.

According to the above embodiment of the present invention, the lower insulating film 31 serving as an isolation insulating film is overlaid with the upper insulating film 32, and this upper insulating film 32 is removed by selective etching, thereby forming the depression 35. As can be seen from this, the depression 35 can be formed without using the lithography technology, and no margin is required for forming the depression 35. The maximal frontage width of the depression 35 can be equal to the width of the isolation trench 13. In addition, since the entire side surface of the floating gate 22a aligns with the side surface of the isolation trench 13 (or the element-formation region 12), there is a constant distance between the adjacent ones of the floating gates 22a, and the floating gates 22a do not have any restrictions on the frontage width of the depression 35. In the present embodiment, therefore, the depression 35 can have an increased frontage width, and the control gate line 26 can be formed inside the depression 35 easily and reliably. The control gate line 26 formed in the depression 35 is effective in suppressing the capacitive coupling between the floating gates.

If the uppermost portion of the isolation insulating film (lower insulating film) 31 is lower than the lower surface of the floating gate 22a, then the upper gate insulating film (ONO film) 23 is the only element located between the control gate line 26 and the semiconductor substrate 11. In this case, it is likely that the capacitive coupling between the control gate line 26 and the semiconductor substrate 11 will become a problem. Therefore, the uppermost portion of the isolation insulating film 31 should be preferably higher than the lower surface of the floating gate 22a, as shown in FIGS. 2A and 2B.

If the uppermost portion of the isolation insulating film 31 is higher than the upper surface of the floating gate 22a, the isolation insulating film 31 covers the entire side surface of the floating gate 22a. In this case, the floating gate 22a is not much exposed, and it is hard to increase the capacitance between the floating gate 22a and the control gate line 26. As shown in FIGS. 2A and 2B, therefore, the uppermost portion of the isolation insulating film 31 should be preferably lower than the upper surface of the floating gate 22a.

If the lowermost portion of the control gate line 26 is higher than the lower surface of the floating gate 22a, the capacitive coupling between the adjacent floating gates 22a may not be sufficiently suppressed by the control gate line 26. Therefore, the lowermost portion of the control gate line 26 (the lowermost portion substantially corresponding to the bottom portion of the depression 35 of the isolation insulating film) should preferably be lower than the lower surface of the floating gate 22a.

In the embodiment described above, selective etching is performed with respect to the upper insulating film 32 and the lower insulating film (isolation insulating film) 31, so as to form the depression 35. Therefore, desirable positional relationships described above can be obtained by controlling the conditions under which the selective etching is performed.

In the embodiment described above, the depression 35 is completely filed with the control gate line 26, as shown in FIGS. 2A and 2B. However, the control gate line 26 may be formed in such a manner as to extend along the surface of the depression 35. In this case as well, the capacitive coupling between the adjacent floating gates 22a can be suppressed. In order to prevent disconnection of the control gate line 26, it is preferable that the depression 35 be completely filled with the control gate line 26.

The lower insulating film 31 and the upper insulating film 32 are so selected as to make the etching rate of the upper insulating film 32 higher than that of the lower insulating film 31. Where the lower insulating film 31 is a CVD insulating film, and the upper insulating film 32 is a coating film, a high etching selection ratio can be set to facilitate the selective etching of the upper insulating film 32.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate including first and second element-formation regions which are partitioned by an isolation trench;
   first and second lower gate insulating films formed on the first and second element-formation regions, respectively;
   first and second floating gates formed on the first and second lower gate insulating films, respectively, the first floating gates including a first side surface and the second floating gate including a second side surface which is opposed to the first side surface, each of the first and second floating gates including an upper surface;
   an isolation insulating film which is formed at least in the isolation trench and which includes a depression formed in an upper surface thereof and an uppermost portion located higher than a surface of the semiconductor substrate and lower than the upper surface of each of the first and second floating gates;
   an upper gate insulating film formed on the first and second floating gates and the isolation insulating film; and
   a control gate line formed on the upper gate insulating film, and including an opposed portion which is opposed to the first and second floating gates, and a portion located inside the depression so that each of the first and second side surfaces of the first and second floating gates is entirely opposed to the control gate line,
   the first side surface of the first floating gate entirely aligning with a side surface included in the first element-formation region and defined by the isolation trench, and the second side surface of the second floating gate entirely aligning with a side surface included in the second element-formation region and defined by the isolation trench.

2. The semiconductor device according to claim 1, wherein the opposed portion of the control gate line is opposed to the upper surfaces of the first and second floating gates and is opposed to those portions of the first and second side surfaces of the first and second floating gates which are located higher than the uppermost portion of the isolation insulating film.

3. The semiconductor device according to claim 1, wherein the control gate line includes a lowermost portion located lower than the surface of the semiconductor substrate.

4. The semiconductor device according to claim 1, wherein the isolation insulating film has a thickness smaller than a half of a width of the isolation trench.

5. The semiconductor device according to claim 1, wherein the isolation insulating film is formed by CVD.

6. The semiconductor device according to claim 1, wherein the depression includes a tapered U-shaped bottom portion.

* * * * *